United States Patent [19]

Hills et al.

[11] Patent Number: 5,685,914
[45] Date of Patent: Nov. 11, 1997

[54] FOCUS RING FOR SEMICONDUCTOR WAFER PROCESSING IN A PLASMA REACTOR

[75] Inventors: Graham W. Hills, Los Gatos; Yuh-Jia Su, Cupertino; Yoshiaki Tanase, Campbell; Robert E. Ryan, Sunnyvale, all of Calif.

[73] Assignee: Applied Materials, Inc., Santa Clara, Calif.

[21] Appl. No.: 223,335

[22] Filed: Apr. 5, 1994

[51] Int. Cl.$^6$ .................................................. C23C 16/00
[52] U.S. Cl. ........................................ 118/723 E; 156/345
[58] Field of Search .......................... 118/723 I, 723 IR, 118/723 E, 723 ER, 723 MP, 728; 156/643, 345; 204/192, 298.32, 298.07, 298.11, 298.15, 298.33, 298.35; 134/1.1

[56] References Cited

U.S. PATENT DOCUMENTS

| | | | |
|---|---|---|---|
| 4,512,283 | 4/1985 | Bonifield et al. | 118/723 |
| 5,213,658 | 5/1993 | Ishida | 156/643 |
| 5,246,532 | 9/1993 | Ishida | 118/723 |
| 5,298,465 | 3/1994 | Levy | 437/225 |
| 5,423,918 | 6/1995 | Gupta et al. | 134/1 |

FOREIGN PATENT DOCUMENTS

| | | |
|---|---|---|
| 0 574 859 | 12/1993 | European Pat. Off. . |
| 2-92215 | 4/1990 | Japan . |
| 3-291928 | 12/1991 | Japan . |
| 91328185 | 6/1993 | Japan . |

Primary Examiner—John Niebling
Assistant Examiner—Joni Y. Chang
Attorney, Agent, or Firm—Michaelson & Wallace

[57] ABSTRACT

In one aspect, the invention is embodied in a plasma reactor for processing a semiconductor wafer, the reactor having a pedestal focus ring surrounding the periphery of the wafer for reducing the process etch rate near the wafer periphery, and plural openings through the pedestal focus ring which permit passage therethrough of particulate contamination, thereby reducing accumulation of particulate contamination near the wafer periphery. In another aspect, in order to reduce corrosive wear of the chamber walls, a removable gas distribution focus ring shields the side walls of the plasma reactor from reactive gases associated with processing of the semiconductor wafer.

19 Claims, 9 Drawing Sheets

(PRIOR ART)

FOCUS RING FOR SEMICONDUCTOR WAFER PROCESSING IN A PLASMA REACTOR

BACKGROUND OF THE INVENTION

1. Technical Field

The invention is related to improvements in a focus ring surrounding the periphery of a semiconductor wafer in a plasma reactor, the focus ring protecting the wafer periphery from gases or plasmas which otherwise have a faster flow rate near the wafer periphery.

2. Background Art

Semiconductor wafer processing steps such as etching or chemical vapor deposition are often carried out using a plasma reactor and a focus ring around the wafer, the focus ring reducing the non-uniformity of the wafer etch rate which is caused by non-uniform plasma distribution across the wafer. Normally, the non-uniform plasma distribution is caused by the non-uniform gas flow distribution across the wafer and other factors such as non-uniform cathode temperature distribution and non-uniform electrical and magnetic field distribution across the wafer. A vacuum pump in the bottom of the chamber continuously draws gases out of the chamber in order to maintain a particular vacuum level in the chamber. The semiconductor wafer is supported in a pedestal in the middle of the chamber. The plasma rushing down toward the vacuum pump has a higher flow rate near the wafer periphery. In an etch reactor, the higher plasma density near the wafer periphery makes the etch rate at the wafer periphery significantly higher than at the wafer's center, which denigrates processing uniformity. Similar denigration of process uniformity occurs in a CVD reactor due to the faster gas flow near the wafer periphery.

Figure 1:
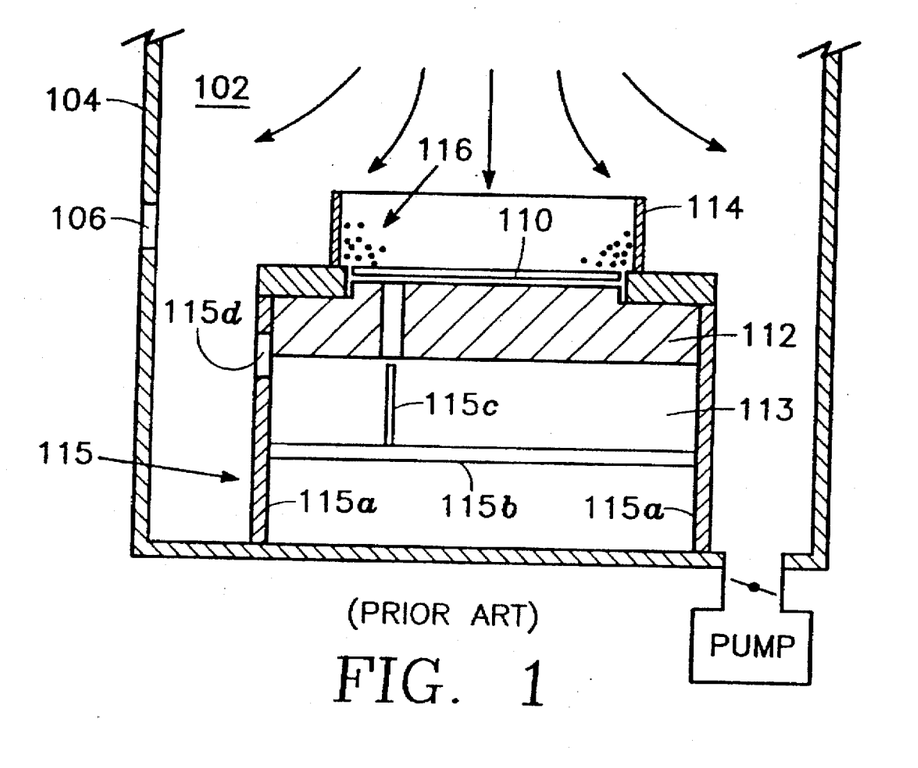
FIG. 1 depicts a conventional technique for reducing gas or plasma flow rate near the wafer periphery in a plasma reactor by employing a focus ring.

FIG. 1 illustrates a conventional technique for slowing down the process etch rate near the wafer periphery in a plasma reactor including a vacuum chamber 102 having chamber walls 104 with a slit valve 106 therethrough for wafer ingress and egress. A wafer 110 is supported on a wafer pedestal 112 over a cathode base 113. The downward direction of gas flow generated by a vacuum pump is indicated by the arrows in FIG. 1. The wafer periphery is shielded by a focus ring 114 resting on the pedestal 112 and surrounding the wafer periphery. The focus ring 114 extends above the wafer periphery by a few centimeters, typically, and the focus ring 114 is supported by a lift mechanism 115 which can move the focus ring 114 up enough to allow the wafer 110 to be transferred between the load lock and the chamber. The lift mechanism 115 has several moving parts including a lift cylinder 115a surrounding the cathode base 113, a lift spider 115b within the cathode base 113 and lift pins 115c supported on the lift spider 115b and extending through vertical bores in the wafer pedestal 112. The cathode base 113 has internal spaces which permit vertical movement of the lift spider 115b within the cathode base 113. A window 115d through the lift cylinder 115a permits the wafer 110 to be transported through the slit valve 106 to the wafer pedestal 112 whenever the lift cylinder 115a is sufficiently raised to align the window 115d with the slit valve 106. Whenever the lift cylinder 115a is so raised, the lift pins 115c extend sufficiently through the bores 112a to slightly lift the wafer 110 above the pedestal 112 so as to permit a wafer transfer blade (not shown) to slide beneath the wafer 110.

While the focus ring 114 does tend to slow the process etch rate near the wafer periphery, it creates another problem in that it tends to trap particulate contamination 116 near the wafer periphery. Such contaminants can reduce die yield near the wafer periphery. Particulate contaminants can be trapped by, among other things, moving parts inside the vacuum chamber 102 such as, for example, the lift mechanism 115, which are necessary for wafer positioning and wafer handling.

Accordingly, there is a need to eliminate the build-up of particulate contamination near the wafer periphery by the focus ring 114 without surrendering any of the advantages of the focus ring and to remove the moving parts including the lift mechanism 115 which move the focus ring 114, in order to reduce particulate contamination.

A related problem with plasma reactors is that by-products from the reaction between the processing gases in the chamber and the semiconductor wafer, as well as the processing gases themselves in some cases, tend to corrode the reactor chamber walls 104 and other parts, requiring that these components be replaced periodically at great expense, thereby greatly increasing the cost of operating such a reactor. Therefore, there is a need to prevent such corrosion or wear of the chamber walls without inhibiting the performance of the reactor.

Moreover, contamination generated during wafer processing in the chamber tends to be distributed across all interior chamber surfaces so that the time required to clean the chamber and return it to production is relatively long, on the order of 24 hours for some designs. Cleaning or removing contamination from the chamber interior and returning it to production involve removing the wafer from the chamber, wet-cleaning the chamber wall and operating the reactor as an etch reactor by introducing etchant gases into the chamber and applying relatively large power to the plasma. During this time, the reactor cannot be productive for processing wafers. Therefore, there is a need to reduce the amount of time required to clean the chamber.

SUMMARY OF THE DISCLOSURE

In one aspect, the invention is embodied in a plasma reactor for processing a semiconductor wafer, the reactor having a pedestal focus ring surrounding the periphery of the wafer for reducing the gas flow rate in the chamber near the wafer periphery and improving the plasma uniformity across the wafer, and plural openings through the pedestal focus ring which permit passage therethrough of particulate contamination, thereby reducing accumulation of particulate contamination near the wafer periphery. In another aspect, in order to reduce corrosive wear of the chamber walls, a removable gas distribution focus ring shields the side walls of the plasma reactor from reactive gases associated with processing of the semiconductor wafer.

DETAILED DESCRIPTION OF THE PREFERRED EMBODIMENTS

Figure 2:
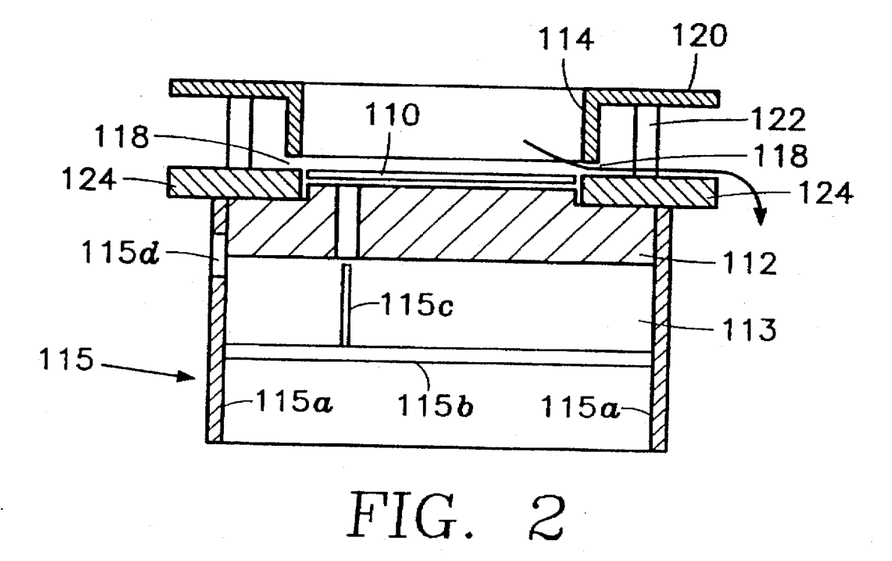
FIG. 2 illustrates one concept of the present invention for reducing particulate contamination otherwise trapped by the focus ring of FIG. 1.

Referring to FIG. 2, particulate contamination near the wafer periphery is reduced by providing a small passage 118 under the focus ring 114 through which the particulate contamination can be evacuated, as indicated by the arrows in FIG. 2. For this purpose, the focus ring 114 in the embodiment of FIG. 2 is suspended from an annulus 120 supported on posts 122. A base annulus 124 resting on a shoulder of the wafer pedestal 112 supports the posts 122. The outflow through the opening 118 passes between the posts 122.

A problem common to each of the embodiments of FIGS. 1 and 2 is that a number of moving parts within the chamber 102 are required in order to accommodate the ingress and egress of the wafer 110 through the slit valve 106. For example, the lift cylinder 115a must move relative to the wafer pedestal 112 in order to align the wafer transfer window 115d therein with the wafer transfer slit valve 106 in the chamber wall 104. Such motion generates particulate contamination within the reactor chamber 126, thereby increasing the risk of loss of die yield due to such contamination.

Figure 3:
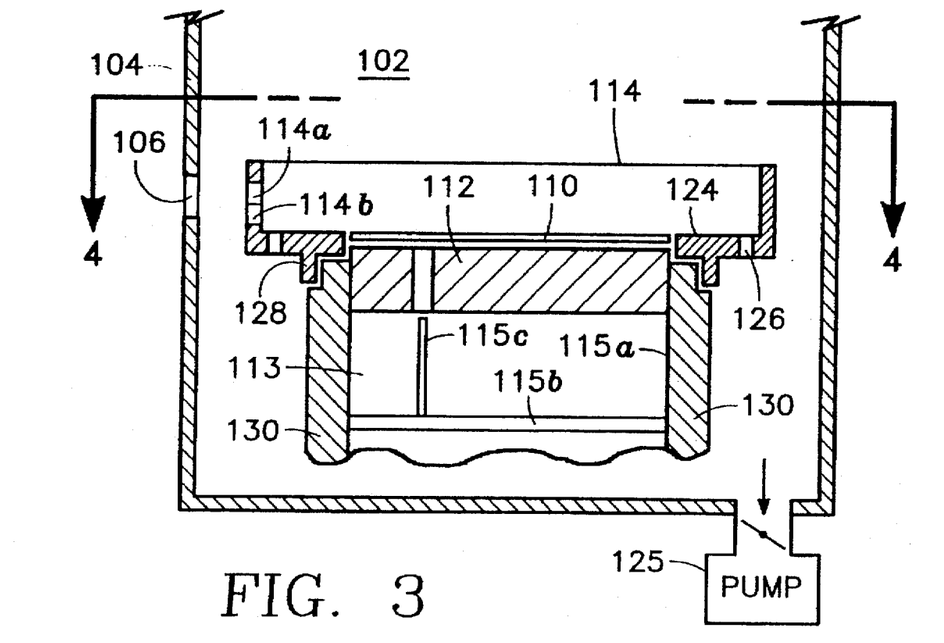
FIG. 3 is a cut-away side view of a plasma reactor including one embodiment of a focus ring of the invention.
Figure 4:
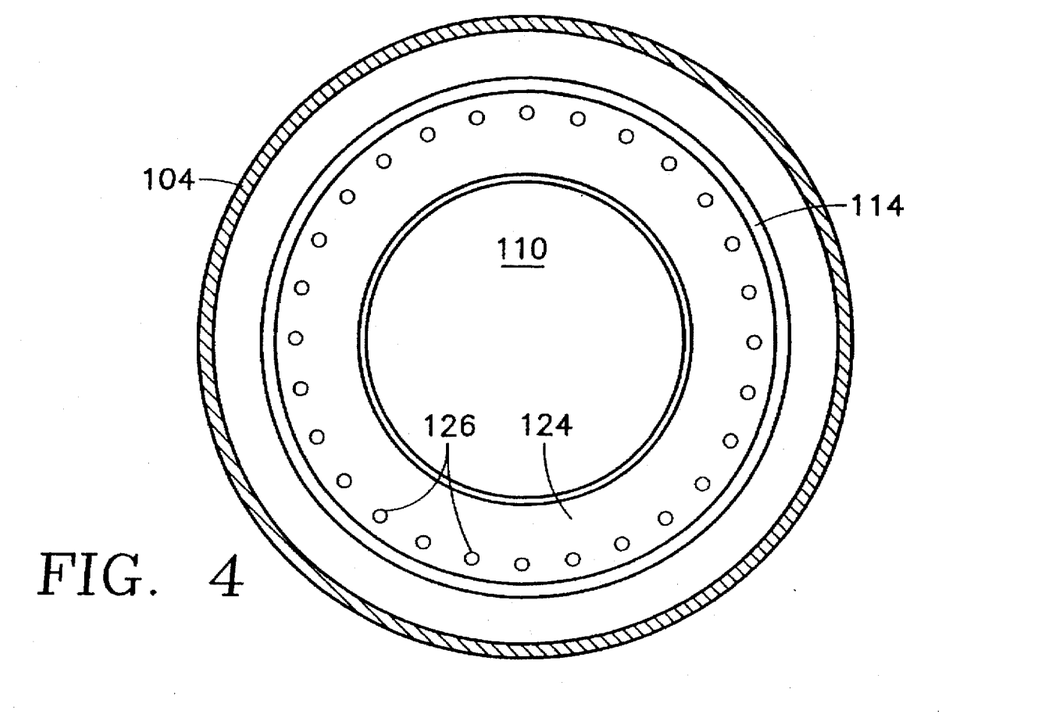
FIG. 4 is a partial cross-sectional view taken along lines 4—4 of FIG. 3.
Figure 5:
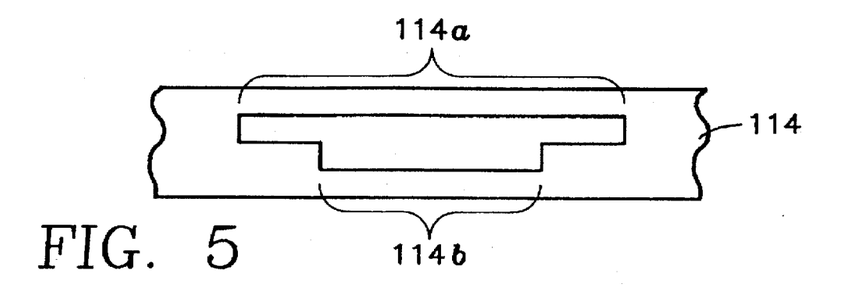
FIG. 5 is a partial side view of the focus ring of FIG. 3 as viewed through a slit valve of the reactor of FIG. 3.

The requirement to move the focus ring and wafer relative to one another is eliminated in the embodiments of FIGS. 3–19. In these embodiments, the only mechanical motion is the lifting of the wafer by the lift pins 115c to permit the blade entering through the slit valve 106 to pass beneath the wafer. The advantage is simplicity of design and reduction of particulate contamination. In FIGS. 3–5, the focus ring 114 rests on the supporting annulus 124, with front openings 114a, 114b therethrough (see FIG. 5) facing the slit valve 106. The opening 114a has a width sufficiently greater than the wafer diameter (e.g., 200 cm) to permit egress and ingress of the wafer therethrough. The opening 114b has a with sufficient to accommodate the wafer blade. The annulus 124 has holes or orifices 126 therethrough which permit particulate contamination to be drawn away by a vacuum pump 125. The annulus 124 has a downwardly extending ring foot 128 nested on an annular ring support 130 adjacent the wafer pedestal 112. The holes or orifices 126 preferably are spaced at ten degree intervals around the annulus 124 and are on the order of at least 110.5 mm in diameter. FIG. 5 is a side view of the focus ring 114 as viewed through the slit valve 106, showing the openings or wafer transfer windows 114a, 114b facing the slit valve 106.

Figure 6:
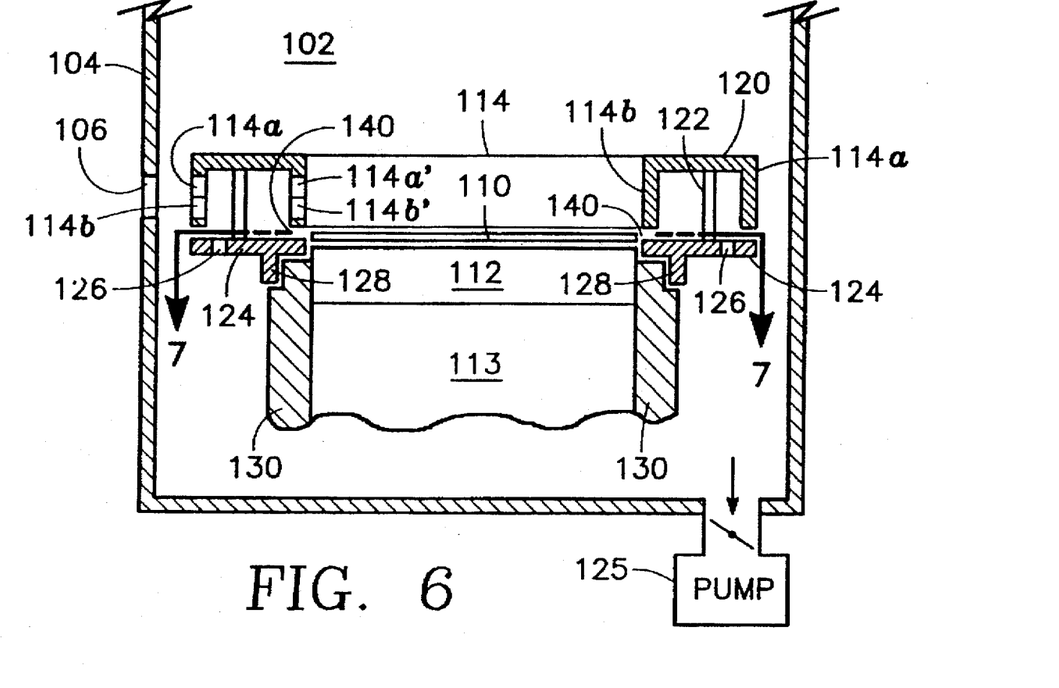
FIG. 6 is a cut-away side view of a plasma reactor including another embodiment of a focus ring of the invention.
Figure 7:
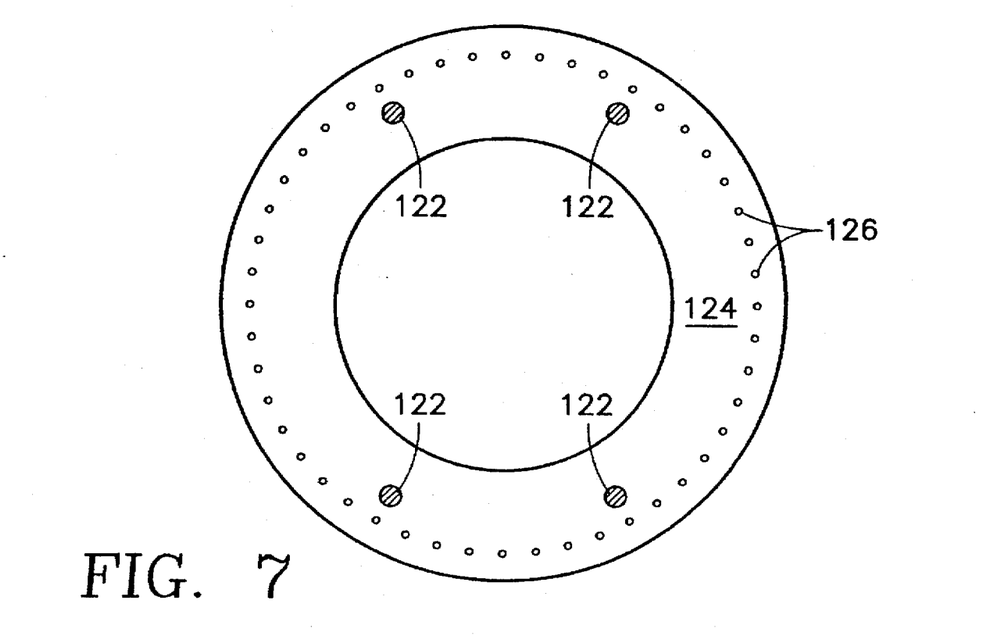
FIG. 7 is a partial cross-sectional view taken along lines 7—7 of FIG. 6.

In the embodiment of FIGS. 6 and 7, the posts 122 support the upper annulus 120 from which are suspended a pair of rings 114c, 114d. The outer focus ring 114c extends all of the way down to the supporting annulus 124, while the inner focus ring 114d overlies a passage 140 through which particulate contamination is drawn towards the orifices 126. The outer and inner rings 114c, 114d have wafer transfer openings or window pairs 114a, 114b and 114a, 114b, respectively, extending therethrough.

Figure 8:
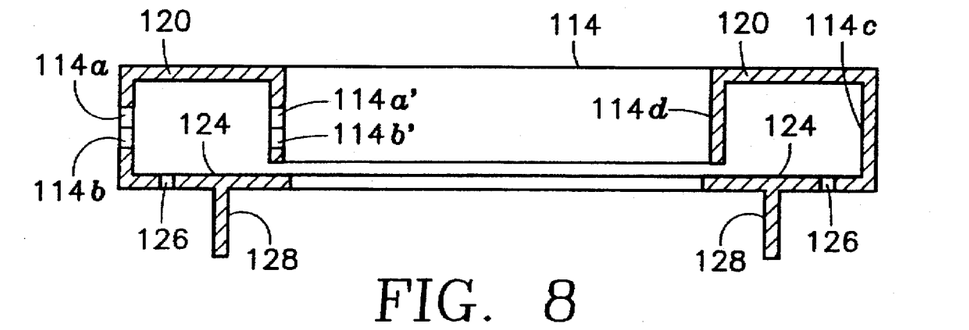
FIG. 8 is a partial side view of a focus ring according to a variation of the embodiment of FIG. 6.

In the embodiment of FIG. 8, the upper annulus 120 is cantilevered from the outer focus ring 114c and the inner focus ring 114d is suspended from the interior edge of the upper annulus 120.

Figure 9:
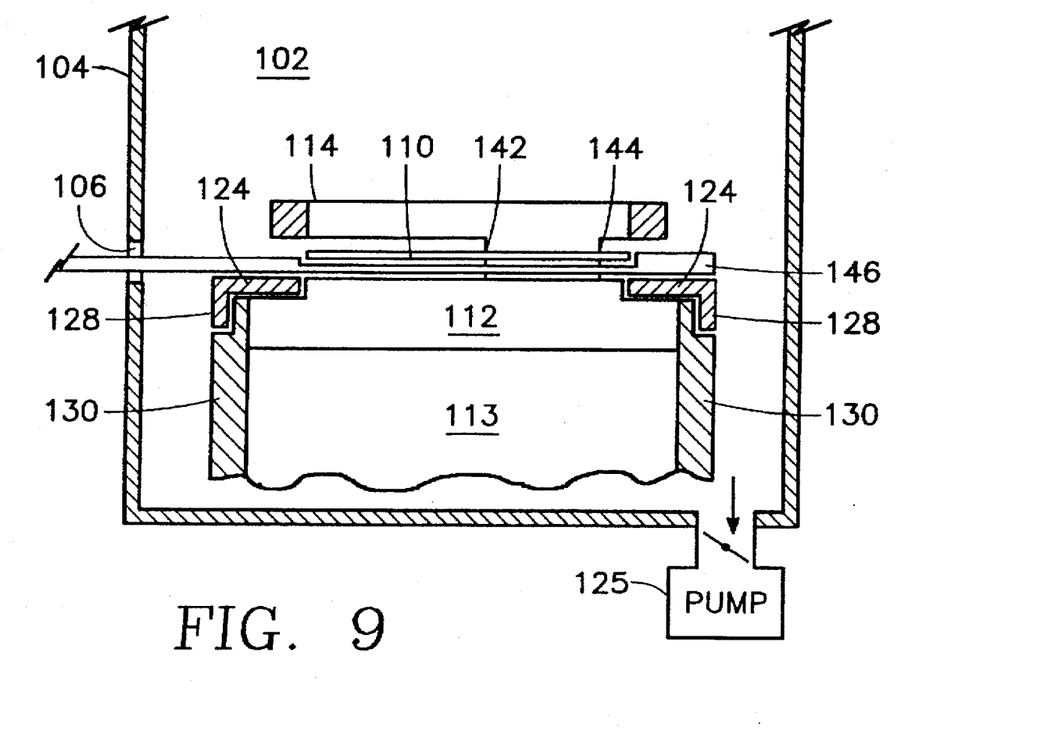
FIG. 9 is a partial cut-away side view of a plasma reactor including a stationary focus ring of the invention.
Figure 10:
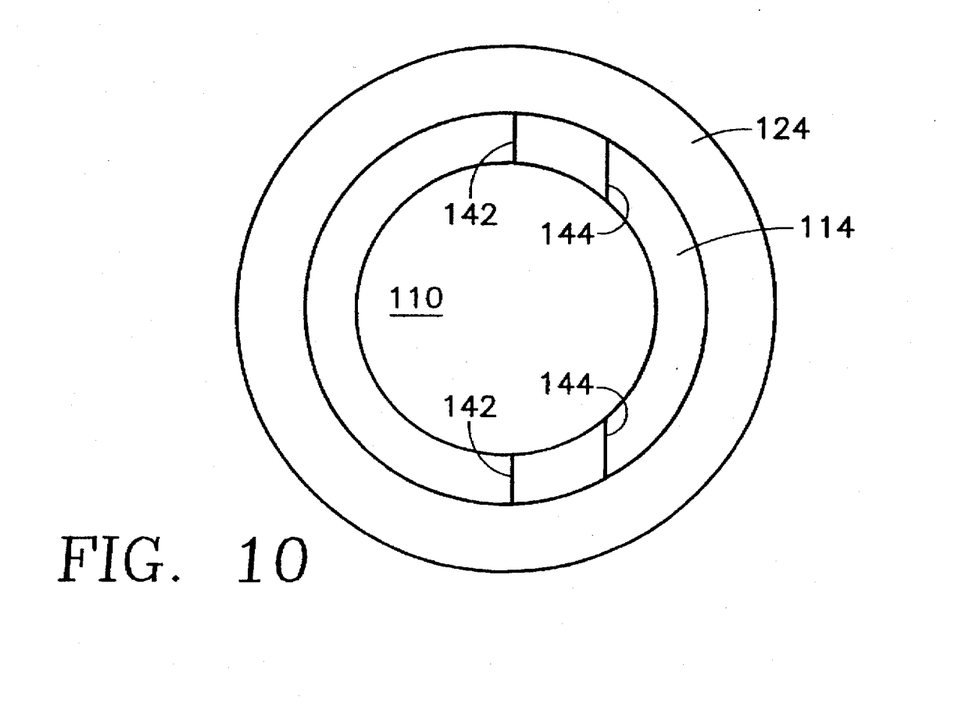
FIG. 10 is a top view of the focus ring of FIG. 9.

In FIGS. 9 and 10, the focus ring 114 rests on the base annulus 124, with a front opening 142 therethrough facing the slit valve 106 and a rear opening 144 therethrough facing the opposite direction. The front opening 142 has a width sufficiently greater than the wafer diameter to permit egress and ingress of the wafer therethrough. The rear opening has a width sufficient to accommodate the front end of a conventional wafer transfer blade 146 in the manner shown in FIG. 9.

Figure 11:
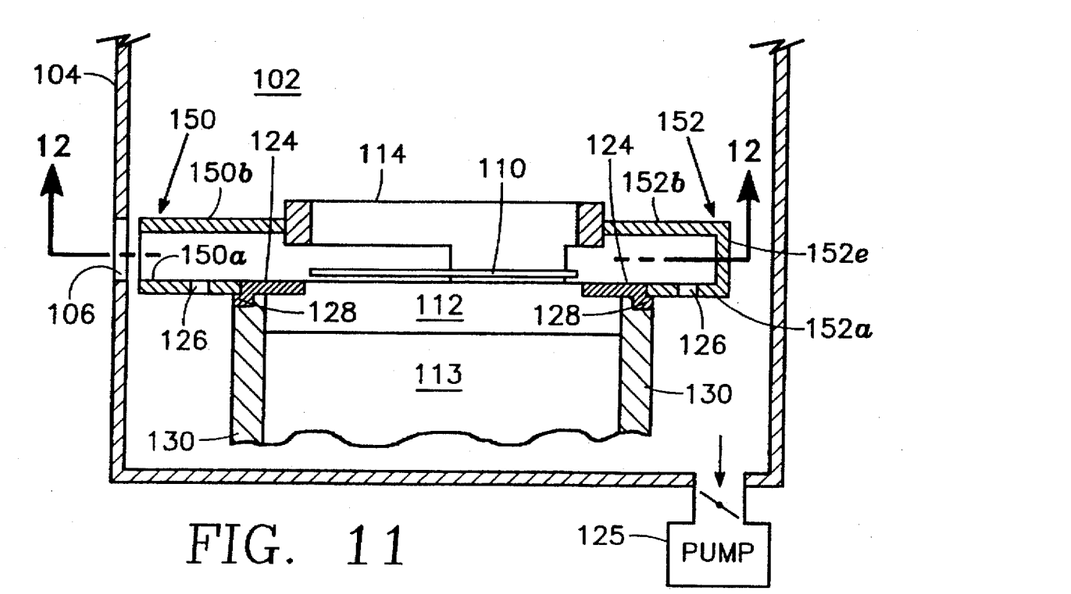
FIG. 11 is a partial side view corresponding to FIG. 9 illustrating a tunnel and compartment associated with the focus ring.
Figure 12:
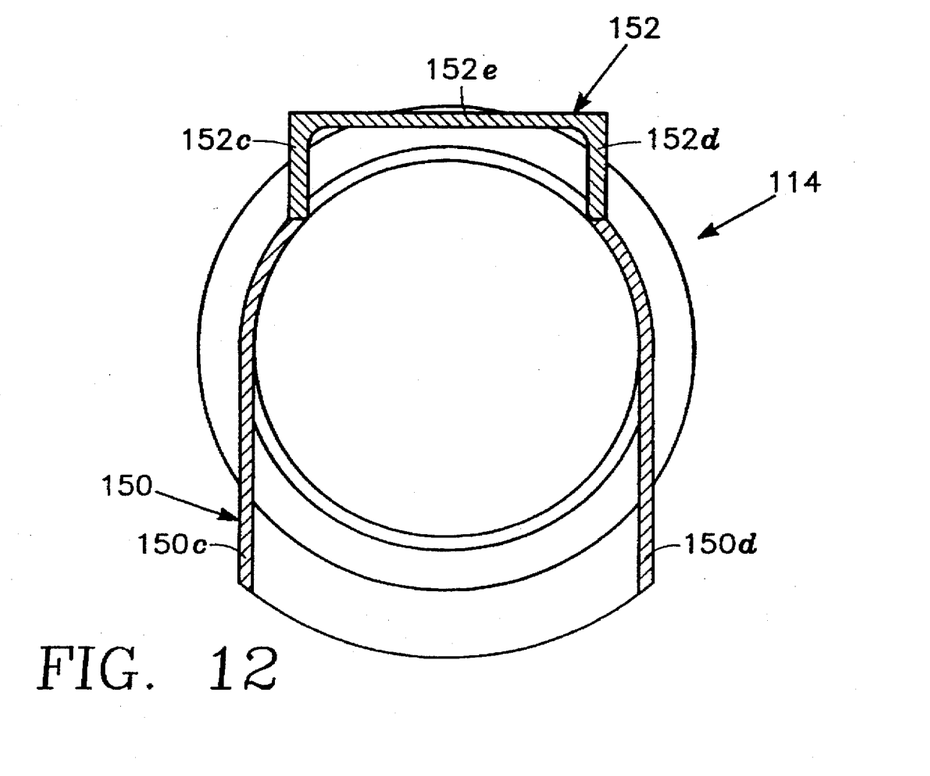
FIG. 12 is a partial cross-sectional view taken along lines 12—12 of FIG. 11.

The openings 142, 144 may reduce the ability of the focus ring 114 of FIGS. 9 and 10 to slow gas flow near the wafer periphery. In order to avoid such a difficulty, the embodiment of FIGS. 9 and 10 is improved as illustrated in FIGS. 11 and 12 by the addition of a tunnel 150 around the front opening 142 and a compartment 152 closing off the rear opening 144. The tunnel 150 has a floor 150a, ceiling 150b and right and left side walls 150c, 150d. The compartment 152 has a floor 152a, ceiling 152b, right and left side walls 152c, 152d and an end wall 152e. Preferably, the holes 126 through which the particulate contamination is drawn off are located in the floors 150a, 152a.

Figure 13:
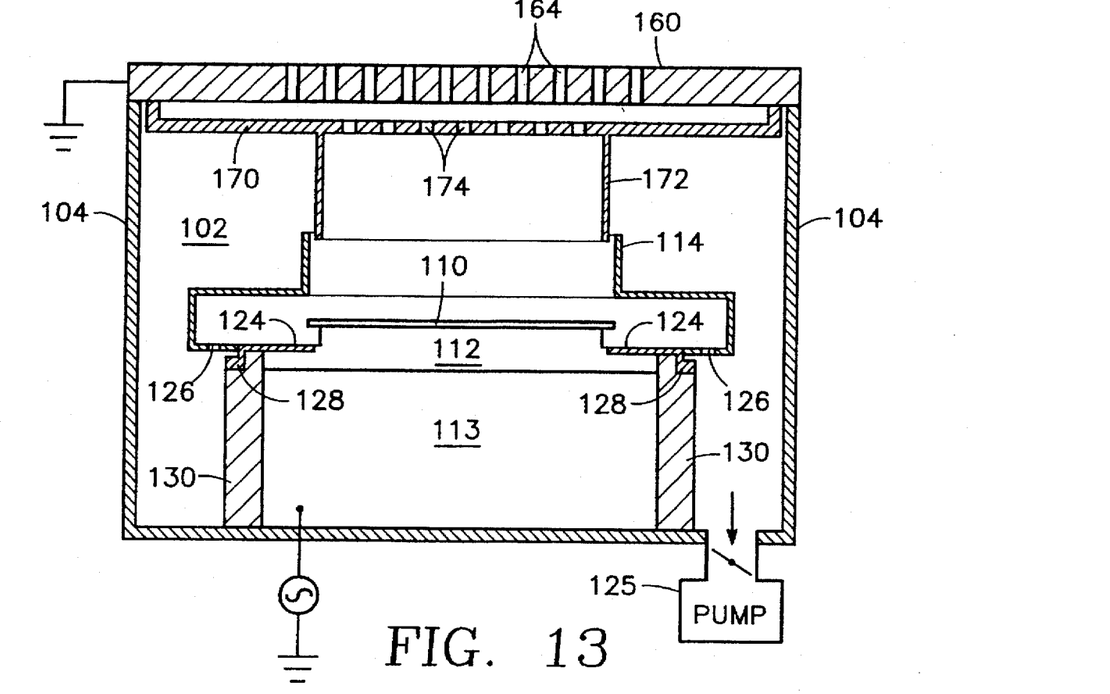
FIG. 13 is a cut-away side view of a plasma reactor including a gas distribution plate and gas distribution plate (GDP) focus ring in accordance with another aspect of the invention.

FIG. 13 illustrates a capacitively coupled reactive ion etch reactor having a conductive top lid 160 supported on the insulating side wall 104 and serving as a grounded anode and an energized cathode base 113 supporting the wafer pedestal 112. Processing gases are introduced through holes 164 in the top lid 160. One problem with such reactors is that corrosive materials are produced by reactions taking place at the surface of the wafer 110, and the plasma produced from gases introduced through the top lid 160 tend to be corrosive, such corrosive materials tending to attack the walls 104 of the reactor chamber 102. As a result, the walls 104 and other parts of the reactor must be periodically replaced at great expense. This greatly increases the cost of operating such a reactor.

In order to reduce such cost, the chamber walls 104 are shielded from such corrosive materials by a disk-shaped gas distribution plate 170 underlying the top lid 160 and a cylindrical gas distribution plate (GDP) focus ring 172 generally concentric with the focus ring 114 and extending therefrom to the gas distribution plate 170. In the illustration of FIG. 13, the focus ring 114 is of the embodiment of FIG. 12, although the embodiment of FIG. 13 can be implemented with any one of the other focus rings described above with reference to FIGS. 2–12. Gas injection orifices or holes 174 through the gas distribution plate 170 are confined to the area surrounded by the GDP focus ring 172, so that the processing gases introduced through the top lid 160 are generally confined away from the chamber walls 104. Because the pump 125 tends to draw all gases in the chamber 102 downwardly, it is not particularly necessary that there be a perfect seal between the pedestal focus ring 114 and the GDP focus ring 172 in order to effectively shield the chamber walls from the reactants emanating from the wafer 110 as well as from the processing gases introduced through the top lid 160.

Such shielding not only reduces the corrosive wear of the chamber walls but also reduces the amount of contamination deposited on the chamber walls, thereby decreasing the amount of time required to clean the reactor chamber, typically by a factor of about 4 (e.g., from 8 hours to 2 hours), a significant advantage.

A related advantage is that the shielding components, including the gas distribution plate 170, the GDP focus ring 172 and the like are replaced periodically at much lower cost than the side walls of the chamber. Typically, the gas distribution plate 170 and the GDP focus ring 172 are made of anodized aluminum and are modular in order to facilitate easy removal and replacement.

Figure 14:
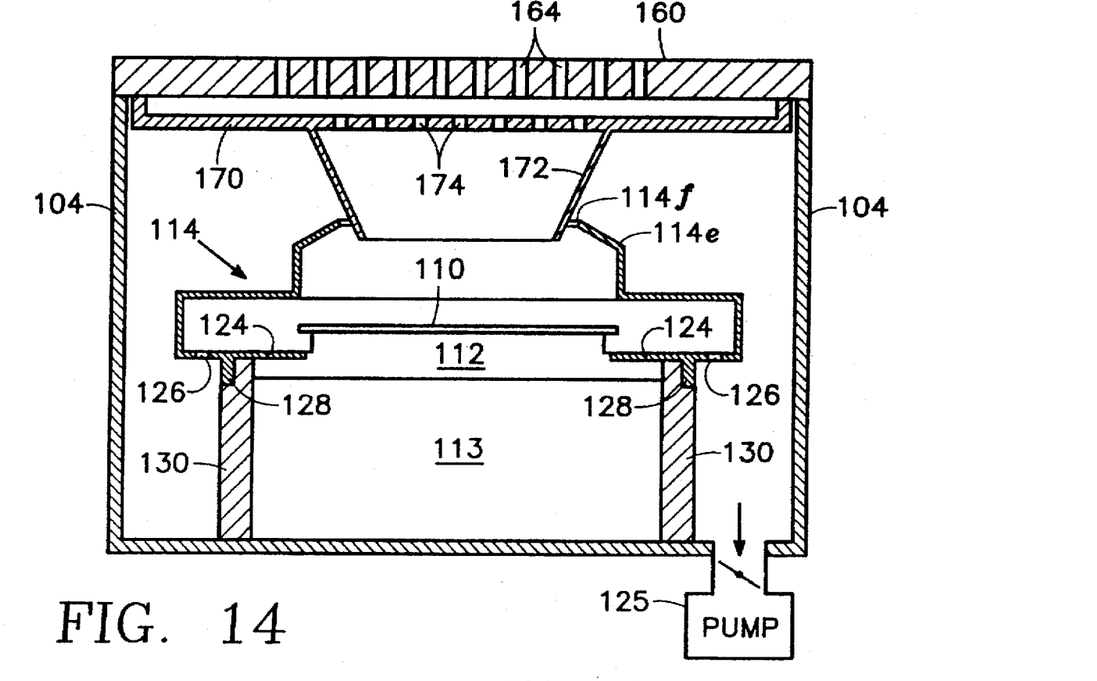
FIG. 14 illustrates an alternative embodiment in which the GDP focus ring is an inverted truncated cone.

FIG. 14 illustrates an alternative embodiment in which the GDP focus ring 172 is in the shape of an inverted truncated cone and the pedestal focus ring 114 has a truncated conical top portion 114e whose inner edge 114f at least nearly meets the bottom portion of the inverted truncated conical GDP focus ring 172.

Figure 15:
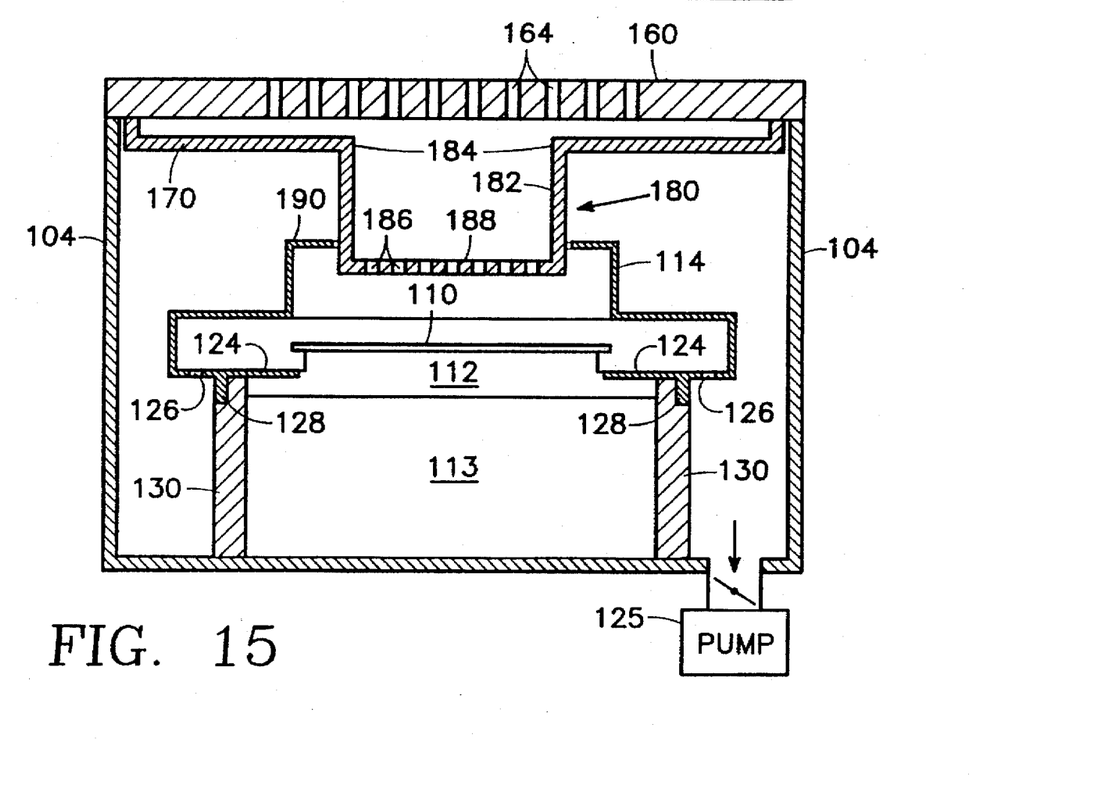
FIG. 15 illustrates an embodiment in which the gas distribution plate has a sunken portion extending toward the pedestal focus ring.

FIG. 15 illustrates an embodiment in which the gas distribution plate 170 includes a sunken center section 180 consisting of a vertical GDP ring 182 concentric with a circular opening 184 in the gas distribution plate 170 and extending downwardly therefrom and a GDP floor 186 suspended from the bottom of the vertical GDP ring 182, the floor having orifices 188 extending therethrough to permit processing gases introduced through the top lid 160 to reach the wafer 110. An annulus 190 extends from the pedestal focus ring 114 toward the vertical GDP ring 182.

Figure 16:
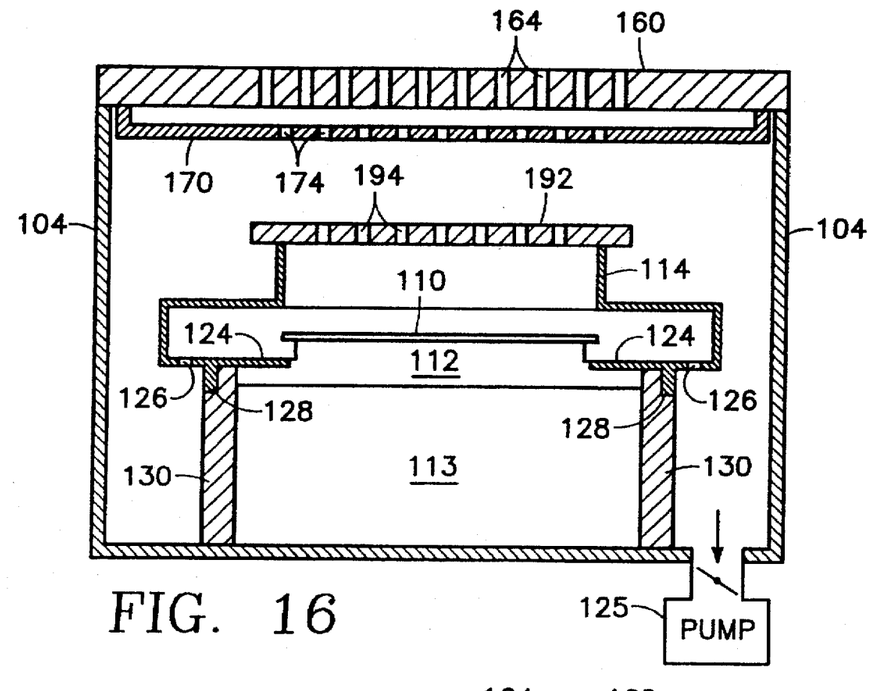
FIG. 16 illustrates an embodiment employing a horizontal GDP focus plate.

In the embodiment of FIG. 16, a GDP focus plate 192 having orifices or holes 194 extending therethrough rests directly on the focus ring 114. In the related embodiment of FIG. 17, the vertical GDP focus ring 182 of FIG. 15 extends downwardly from the gas distribution plate 170 toward the GDP focus plate 192. In the embodiment of FIG. 18, the GDP focus ring 182 assumes an inverted truncated conical shape.

Figure 17:
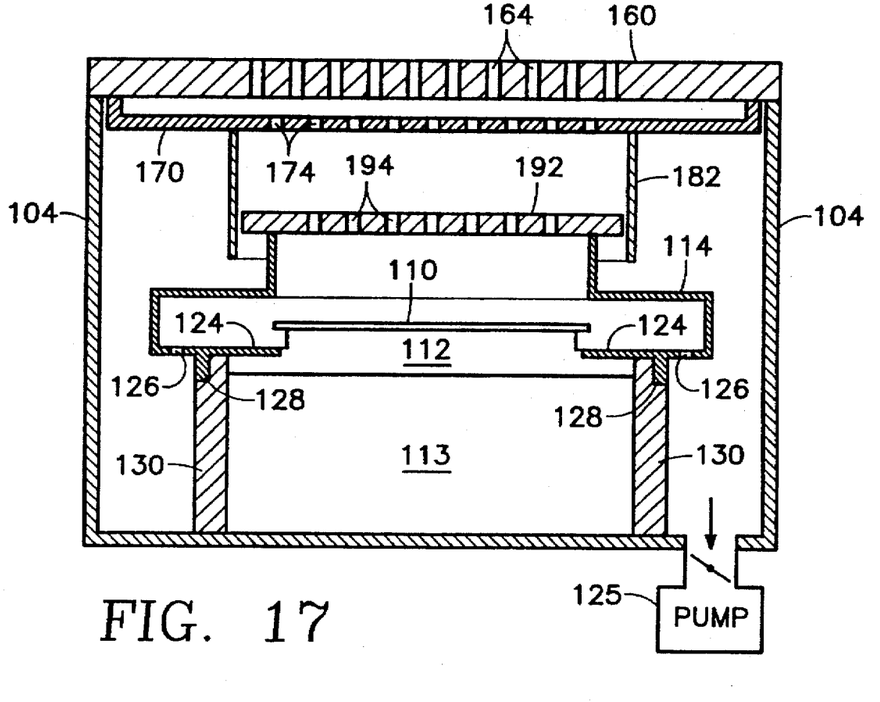
FIG. 17 illustrates an alternative embodiment employing both a GDP focus plate and a GDP focus ring.
Figure 18:
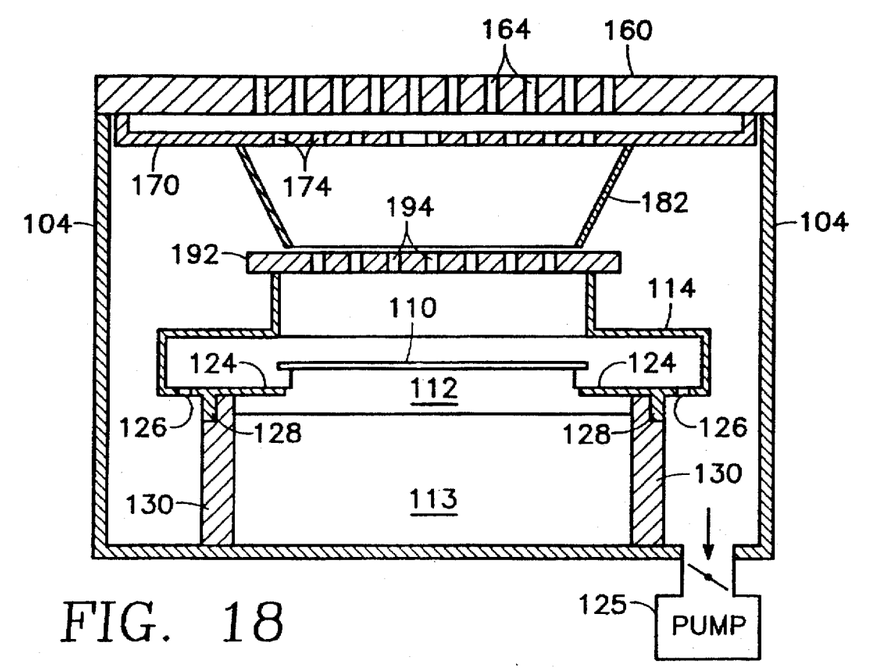
FIG. 18 illustrates a variation of the embodiment of FIG. 17 in which the GDP focus ring is a truncated inverted cone.
Figure 19:
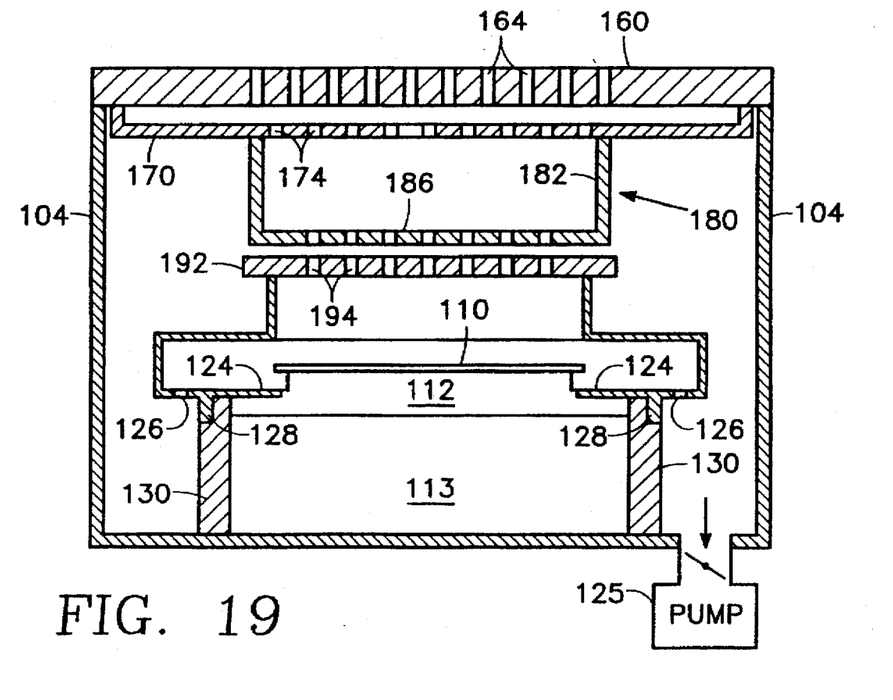
FIG. 19 illustrates an alternative embodiment employing a GDP focus plate and in which the gas distribution plate has a sunken portion extending toward the GDP focus plate.

The embodiment of FIG. 17 is modified in FIG. 19 by eliminating the GDP focus ring and substituting instead thereof the gas distribution plate 170 of FIG. 15 having the sunken center section 180 including the vertical GDP ring 182 and GDP floor 186 facing the GDP focus plate 192.

The pedestal focus ring, the gas distribution plate, the gas distribution focus ring and their component parts may be made of anodized aluminum. If the wafer 110 is an 8-inch diameter wafer, then the pedestal focus ring 114 has a vertical height of about 0.5 to 1.0 inch above the plane of the wafer. Typically, the chamber ceiling is about 3 inches above the wafer 110 while the focus ring is about 1.5 inches inboard of the chamber side wall.

While the invention has been described in detail by specific reference to preferred embodiments, it is understood that variations and modifications thereof may be made without departing from the true spirit and scope of the invention.

What is claimed is:

1. A plasma reactor for processing a semiconductor wafer, said reactor having a pedestal focus ring comprising:

a base annulus surrounding the periphery of the wafer;

a cylindrical ring wall extending upwardly near the base annulus; and a passageway for permitting passage therethrough of particulate contamination during wafer processing operations, said passageway comprising plural openings extending through the base annulus.

2. The plasma reactor of claim 1 further comprising:

a gas distribution plate near a ceiling of said reactor having gas injection orifices therein; and means extending between said gas distribution plate and said pedestal focus ring for shielding side walls of the plasma reactor from reactive gases associated with processing of said semiconductor wafer.

3. The reactor of claim 1, wherein said focus ring further comprises:

plural supporting posts extending upwardly from said base annulus to a height above a plane of said wafer and surrounding said wafer;

an upper annulus resting on said supporting posts; and a vertical ring wall extending downwardly from an inner edge of said upper annulus facing said wafer toward said base annulus and surrounding said wafer, and wherein said passage means further comprises a space between a bottom edge of said vertical ring wall and said base annulus.

4. The reactor of claim 1, wherein said focus ring further comprises:

an upper annulus resting on a top edge of said cylindrical ring wall; and a second vertical ring wall extending downwardly from an inner edge of said upper annulus facing said wafer toward said base annulus and surrounding said wafer, and wherein said passage means further comprises a space between a bottom edge of said second vertical ring wall and said base annulus.

5. The reactor of claim 1 further comprising an external wafer transfer slit valve, and wherein said focus ring has a slit opening therethrough in registration with said slit valve.

6. The reactor of claim 2 wherein said means for shielding comprises a gas distribution focus ring concentric with and extending toward said pedestal focus ring.

7. The reactor of claim 6 wherein said gas distribution focus ring is one of the following shapes: (a) cylinder, and (b) inverted truncated cone.

8. The reactor of claim 2 wherein said means for shielding comprises a sunken portion of said gas distribution plate extending away from said ceiling and toward said pedestal focus ring.

9. The reactor of claim 8 wherein said sunken portion of said gas distribution plate comprises a cylindrical wall and a floor having gas flow passages therethrough, and wherein said pedestal focus ring comprises an annulus supported along a top edge thereof and extending toward said cylindrical wall of said gas distribution plate.

10. The reactor of claim 2 wherein said means for shielding comprises a focus plate overlying said wafer over a top edge of said pedestal focus ring, said focus plate having gas flow passages therethrough.

11. The reactor of claim 10 further comprising a gas distribution focus ring extending from said gas distribution plate toward said focus plate.

12. The reactor of claim 11 wherein said gas distribution plate, said focus plate, said gas distribution focus ring and said pedestal focus ring all have circular cross sections.

13. The reactor of claim 11 wherein said gas distribution plate, said focus plate and said pedestal focus ring all have circular cross-sections, while said gas distribution focus ring has an inverted truncated conical shape.

14. The reactor of claim 10 further comprising a sunken portion of said gas distribution plate extending toward said focus plate, said sunken portion of said gas distribution plate having gas flow passages therethrough.

15. A plasma reactor for processing a semiconductor wafer, said reactor having a pedestal focus ring surrounding the periphery of the wafer and an external wafer transfer slit valve, said pedestal focus ring having a slit opening therethrough in registration with said slit valve of said reactor.

16. The reactor of claim 15 further comprising a tunnel between said slit valve and said slit opening of said focus ring.

17. The reactor of claim 16 further comprising plural openings through a floor of said tunnel for permitting withdrawal of particulate contamination from within said tunnel.

18. The reactor of claim 17 further comprising a rear opening in said focus ring opposite said slit opening for accommodating a wafer blade during insertion of a wafer into said reactor, a compartment surrounding said rear opening and plural openings through a floor of said compartment for permitting withdrawal of particulate contamination from within said compartment.

19. A plasma reactor for processing a semiconductor wafer, said reactor comprising:

a pedestal focus ring surrounding the periphery of the wafer, said pedestal focus ring comprising a passageway for permitting passage therethrough of particulate contamination during wafer processing operations;

a gas distribution plate near a ceiling of said reactor having gas injection orifices therein;

means extending between said gas distribution plate and said pedestal focus ring for shielding side walls of the plasma reactor from reactive gases associated with processing of said semiconductor wafer, said means for shielding comprising, a focus plate overlying said wafer over a top edge of said pedestal focus ring, said focus plate having gas flow passages therethrough, and a gas distribution focus ring extending from said gas distribution plate toward said focus plate; and wherein, said gas distribution plate, said focus plate and said pedestal focus ring all have circular cross-sections, while said gas distribution focus ring has an inverted truncated conical shape.

* * * * *